US012761263B2

(12) United States Patent
Senerth

(10) Patent No.: US 12,761,263 B2
(45) Date of Patent: Oct. 13, 2026

(54) INSULATION INTEGRITY DETERMINATION

(71) Applicant: Boom Technology, Inc., Centennial, CO (US)

(72) Inventor: James Senerth, Philadelphia, PA (US)

(73) Assignee: Boom Technology, Inc., Centennial, CO (US)

( * ) Notice: Subject to any disclaimer, the term of this patent is extended or adjusted under 35 U.S.C. 154(b) by 309 days.

(21) Appl. No.: 18/329,318

(22) Filed: Jun. 5, 2023

(65) Prior Publication Data

US 2024/0402235 A1 Dec. 5, 2024

(51) Int. Cl.
*G01R 31/52* (2020.01)
*G01R 31/12* (2020.01)

(52) U.S. Cl.
CPC ......... *G01R 31/1227* (2013.01); *G01R 31/52* (2020.01)

(58) Field of Classification Search
CPC .............. G01R 31/52; G01R 31/58–60; G01R 31/005–008; G01R 31/08–086; G01R 31/12; G01R 31/1227
See application file for complete search history.

(56) References Cited

U.S. PATENT DOCUMENTS

| | | | | |
|---|---|---|---|---|
| 4,739,275 A * | 4/1988 | Kimball | G01R 31/52 | 324/529 |
| 5,325,068 A * | 6/1994 | Rauf | G01R 31/129 | 324/73.1 |
| 6,225,811 B1 * | 5/2001 | Bruning | G01R 31/58 | 324/544 |
| 2008/0020627 A1 * | 1/2008 | Sexton | H02H 3/38 | 439/404 |
| 2014/0368211 A1 * | 12/2014 | Inoue | B60L 3/0069 | 324/509 |
| 2018/0348289 A1 * | 12/2018 | Tillotson | G01R 31/1272 | |
| 2021/0033645 A1 * | 2/2021 | Kim | H01M 8/04686 | |
| 2022/0025894 A1 * | 1/2022 | Mayleben | H02H 7/08 | |

* cited by examiner

*Primary Examiner* — Lee E Rodak
*Assistant Examiner* — Demetrius R Pretlow
(74) *Attorney, Agent, or Firm* — Brake Hughes Bellermann LLP

(57) ABSTRACT

A device may include a switch having a first position in which the switch connects a voltage source to the conductor segment and a second position in which the conductor segment is connected to operational electronics. A device may include a switch controller configured to change the switch between the first position and the second position. A device may include a current sensor configured to detect a leakage current from the conductor segment when the switch controller causes the switch to be in the first position.

30 Claims, 9 Drawing Sheets

INSULATION INTEGRITY DETERMINATION

TECHNICAL FIELD

This description relates to a method and system to test a conductor segment for failures.

BACKGROUND

Identifying failures in wires, cables, wiring harnesses, and other conductor segments within electronic or vehicle assemblies is a challenge. Wiring failures are sometimes detected on condition when a subsystem malfunctions. Latent failures in insulation or sheathing often go undetected, however, until an arcing event occurs that, e.g., causes a subsystem to malfunction. Additionally, intermittent wiring faults are difficult to detect without replicating the condition for which the fault occurs.

SUMMARY

In some aspects, the techniques described herein relate to a device for determining an insulation integrity of a conductor segment, the device including: a switch having a first position in which the switch connects a voltage source to the conductor segment and a second position in which the conductor segment is connected to operational electronics; a switch controller configured to change the switch between the first position and the second position; and a current sensor configured to detect a leakage current from the conductor segment when the switch controller causes the switch to be in the first position.

In some aspects, the techniques described herein relate to a method for determining an insulation integrity of a conductor segment, the method including: toggling, via a switch controller, a switch to a first position connecting the conductor segment to a voltage source, the switch further having a second position connecting the conductor segment to operational electronics; measuring a leakage current from the conductor segment using a current sensor positioned between the voltage source and the operational electronics; and toggling the switch to the second position.

DETAILED DESCRIPTION

Figure 1:
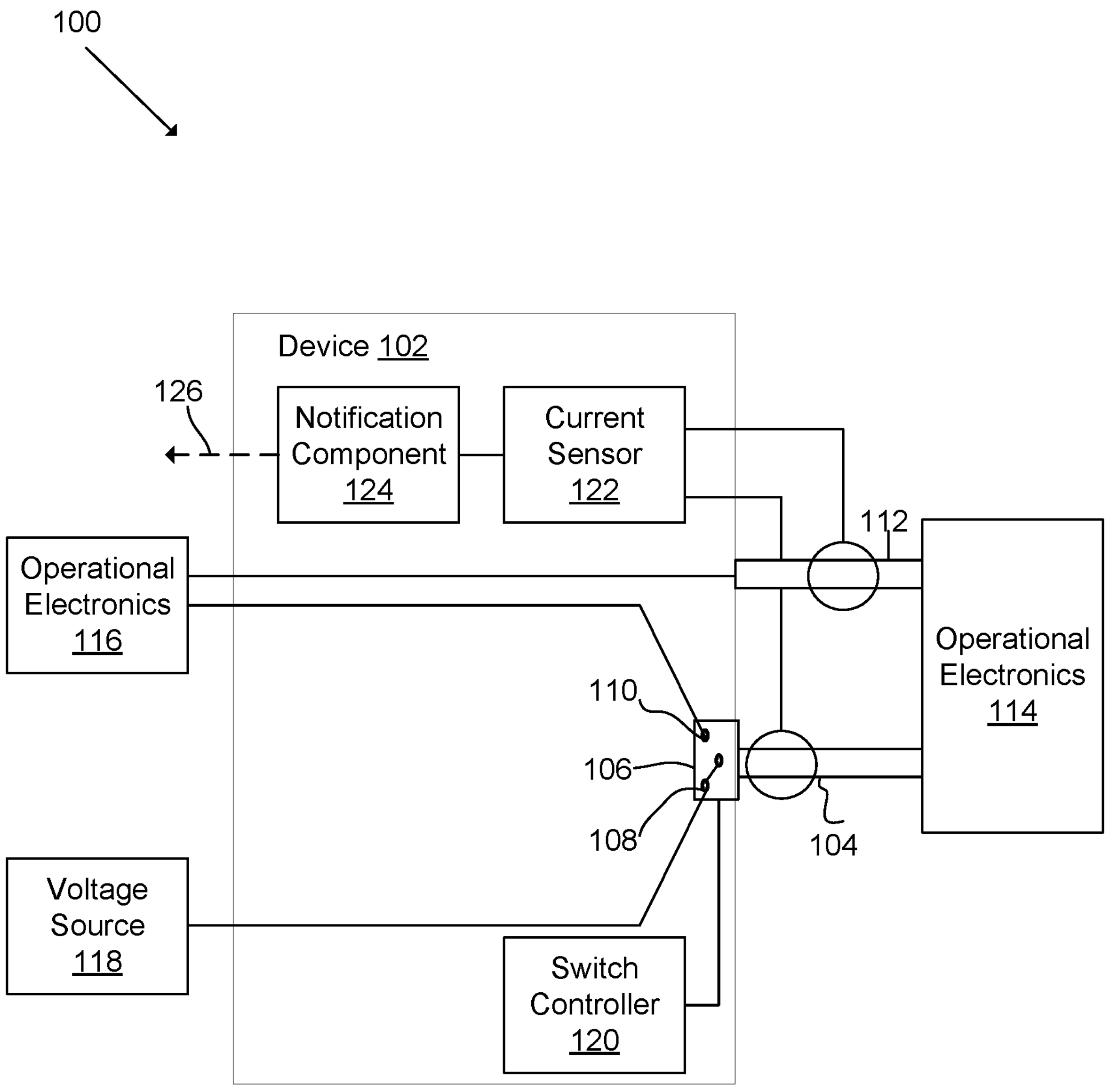
FIG. 1 depicts an example device for determining an insulation integrity of a conductor segment, according to examples described throughout this disclosure.

The present disclosure describes novel devices, methods, and systems for identifying problems with, e.g., wiring, cable, or wire harness insulation over a conductor segment. The conductor segment can be a wire, wire shield, overbraid, sheathing, cable, or wiring harness including a collection of wires and connectors. The disclosure describes isolating a conductor segment from a default circuit, applying a reference voltage to the conductor segment, and measuring a leakage current from the conductor segment using a current sensor. A current indication may then be sent based on the measured leakage current.

Identifying failures in wires, cables, and wiring harnesses within complicated electronic or vehicle assemblies is a technical problem. Failures are often only detected upon failure or malfunction of a subsystem. Latent failures may include, for example, worn, cracked, broken, or low dielectric strength insulation or sheathing that allows intermittent or constant arcing to occur without consuming enough power to cause a related circuit protection device to open. Latent failures often go undetected until a large enough arcing event occurs, causing disruption. It can be notoriously difficult to isolate and identify wiring faults, and subsystems must often be disassembled by technicians to troubleshoot.

Current leakage due to a wiring or insulation failure can cause arcing in combustible environments with explosion risks, which can cause ignitions that endanger safety and equipment. In aviation, fuel tank ignitions are a big safety concern, such as the fuel tank ignition that caused the loss of TWA flight 800. In response to that accident and others, the FAA issued the Fuel Tank Flammability Reduction rule (Reference 14 CFR 25.981 and Advisory Circular 25.981-1D) for passenger aircraft, which requires that aircraft reduce the risk of fuel tank flammability, in part, by addressing the electrical wiring interconnection system.

As little as 200 microjoules of energy from an arc in a conductor can ignite fuel vapor. Arcing current can travel via other wires or a metal conduit to a fuel tank, where it can ignite the fuel vapor therein. In aviation, only wires deemed intrinsically safe, or those that carry sufficiently low energy, are allowed to come into contact with a fuel tank. In conventional scenarios, wires that are not considered to be intrinsically safe must be kept a safe distance away from the fuel tank. Additionally, such wires require a fault tolerant installation and design to ensure that no combination of two failures, including a latent failure, can cause a fuel tank ignition.

Aviation manufacturers may attempt to reduce ignition risk of non-intrinsically safe wires via, e.g., physical barriers, circuitous wire routing, and/or isolation from any fuel tank structure or interconnecting wiring. After complicated wiring installation techniques have been completed, the installation must be reviewed and approved. Periodic testing of the installation may also be required.

Wiring failures may lead to various problems in other contexts, as well. For example, in communications contexts, wiring failures can generate noise that results in lost data packets and information. In corrosive environments (or other environments that put a high level of wear on insulation, sheathing, or wiring), latent problems can develop undetected that lead to eventual hard failures.

The present description and claims provide technical solutions for determining an insulation integrity of a conductor segment using at least, e.g., a switch, a switch controller, and a current sensor. The switch controller changes the switch between a first position in which the switch connects a voltage source to the conductor segment and a second position in which the conductor segment is connected to operational electronics. The current sensor detects a leakage current from the conductor segment and determines the integrity of the insulation based on the leakage current. The device may thus provide an automatic way to test for the insulation integrity of a wire that is integral to an electronics assembly. Consequently, testing of conductor segments may be performed frequently, without maintenance burden or aircraft down time, and with ease. The described techniques enable convenient and reliable confirmation that the insulation on a conductor segment is intact. Therefore, the danger of arcing may be minimized or eliminated, so that the conductor segment may be determined to be intrinsically safe. As a result, the conductor segment may be positioned closer to a fuel tank or other combustible component, and difficulties such as barriers, wire routing requirements, and isolation requirements of prior solutions may be avoided.

FIG. 1 depicts system 100, in accordance with an example. System 100 includes a device 102. System 100 may further include any combination of: conductor segment 104, a reference conductor segment 112, operational electronics 114, operational electronics 116, and a voltage source 118.

Device 102 is operable to determine an insulation integrity for conductor segment 104. An insulation integrity refers to an indication of the dielectric properties of an insulation in conductor segment 104, which may be affected by the following non-inclusive list: the thickness of an insulation, the composition of an insulation, and the condition of the insulation. In examples, these properties may change over the lifetime of conductor segment 104. For example, if conductor segment 104 is positioned in an environment with corrosive fluids or gasses or mechanical vibrations, the dielectric properties of the insulation around conductor segment 104 may degrade over time. Eventually, the insulation around conductor segment 104 may be insufficient to prevent arcing events. In such cases, device 102 may determine that the insulation integrity is insufficient, prior to occurrence of such arcing events.

In examples, the conductor segment may be one of a wire or a wire shield, or a conductive portion of a wire harness assembly (i.e., a conductive overbraid).

Device 102 is positioned in series between operational electronics 114 and operational electronics 116. In examples, operational electronics 114 and operational electronics 116 may comprise any type of electronic devices including any combination of digital and analog components. In examples, operational electronics 116 may be a master type device and operational electronics 114 may be a slave type device, or vice versa. In further examples, however, operational electronics 116 may simply be a device operable to relay commands and telemetry between operational electronics 114 and a further device (not shown in FIG. 1) that is in communication with operational electronics 116.

In one example that will be discussed with regards to FIG. 3 below, operational electronics 114 may include electronics for an airplane fuel tank, and operational electronics 116 may be a controller that sends commands to, and/or receives telemetry for, some part of the fuel subsystem of the aircraft.

Device 102 includes a switch 106 operated by a switch controller 120. In examples, switch 106 may be a two-position integrated circuit switch or a relay switch. In examples, switch 106 may include further switch positions, however. For example, switch 106 may include an open position that does not connect conductor segment 104 to any electronics.

In examples, switch controller 120 may be operable to execute logic and/or provide a signal to toggle switch 106 between first position 108, second position 110, and/or further positions. Switch controller 120 may be a device designed to control the operation of one or more switches in an electrical or electronic system. Switch controller 120 may be used to regulate the flow of current through switch 106, for example, to be turned on and off in a precise and controlled manner. Switch controller 120 may include a microcontroller or may be implemented via electronics, for example via a field programmable gate array (FPGA) or software. Switch controller 120 may be programmed to monitor the state of switch 106 and respond to changes in its position. Switch controller 120 may also include a variety of sensors or other input devices that are used to detect changes in the environment or other factors that may affect the operation of the switches.

In operation, switch controller 120 may receive input signals and use these signals to determine the appropriate action to take. Switch 106 may activate or deactivate a corresponding relay or other device to allow current to flow through (or cut off the flow of current though) switch 106. In examples, switch controller 120 may include other features and functions, such as built-in diagnostic tools, remote control capabilities, and/or programmable logic.

Switch 106 includes a first position 108 in which switch 106 connects voltage source 118 to conductor segment 104. Voltage source 118 may be a driver voltage selected to test the insulation integrity of conductor segment 104. In examples, voltage source 118 may be between 500V and 1000V.

Switch 106 further includes a second position 110 in which conductor segment 104 is connected to operational electronics 116. In examples, second position 110 may be the nominal operational, or non-test configuration for switch 106. In examples, operational electronics 116 may comprise a computer receiving telemetry from, or sending commands to, operational electronics 114.

System 100 includes a current sensor 122 configured to detect a leakage current from conductor segment 104 when switch controller 120 causes switch 106 to be in first position 108. The leakage current may correspond to an electrical current that flows through a component or electrical device under test when a potential from voltage source 118 is applied between two conductors. Voltage source 118 may be selected to be high enough to stress the insulation and test the ability of the insulation to withstand the high potential. If conductor segment 104 and operational electronics 114 are properly insulated the high voltage from voltage source 118 should not cause any significant electrical current to flow between conductor segment 104 and reference conductor segment 112 and detected by current sensor 122.

Leakage current from conductor segment 104 to reference conductor segment 112 indicates a breakdown in the condition of insulation, poor insulation resistance, or other latent faults in conductor segment 104, operational electronics 114, and/or reference conductor segment 112. When there are latent failures in conductor segment 104, operational electronics 114, and/or reference conductor segment 112, the voltage applied via voltage source 118 may cause electrical breakdown, which can lead to damage to and/or failure of a critical electrical subsystem.

Current sensor 122 is connected in series between voltage source 118 and operational electronics 114 and configured to sense the current around conductor segment 104 and a reference conductor segment 112. In examples, conductor segment 112 is a second conductor segment and may comprise a signal line, a ground line, or a neutral line for operational electronics 114. In examples, current sensor 122 may be a comparator circuit, a hall effect sensor, or any other type of current sensor. In examples, current sensor 122 may sense low level current in the milliamps range typically used in integrated circuit sensing.

Leakage current measured by current sensor 122 may be compared to acceptable limits for a particular device, environment, or safety standard. In examples, a signal may be sent from current sensor 122 to notification component 124 indicating whether the leakage current exceeds the acceptable limits.

In examples, current sensor 122 may be operable to measure the leakage current below 5, 1, or 0.5 mAmps. By allowing for the very sensitive detection of leakage current, it may be possible to detect smaller defects in insulation.

In examples, current sensor 122 may be further configured to determine that the leakage current is higher than a threshold current. In examples, the threshold current may be determined based on an application or safety regulation. For example, in an aircraft the threshold current may be set to prevent more than 200 mJ of energy arcing from any of conductor segment conductor segment 104, operational electronics 114, or reference conductor segment 112.

Notification component 124 may comprise any component operable to provide a notification characterizing the insulation integrity, based on the leakage current. In examples, notification component 124 may process and/or pass through a signal from current sensor 122 indicating that a leakage current either exceeds or does not exceed a threshold. In examples, notification component 124 may send a signal via communications path 126 to a further electronics component. In examples, communications path 126 may comprise a wired or wireless connection. For example, communications path 126 may send a notification to operational electronics 116 or any other computing device.

Figure 2:
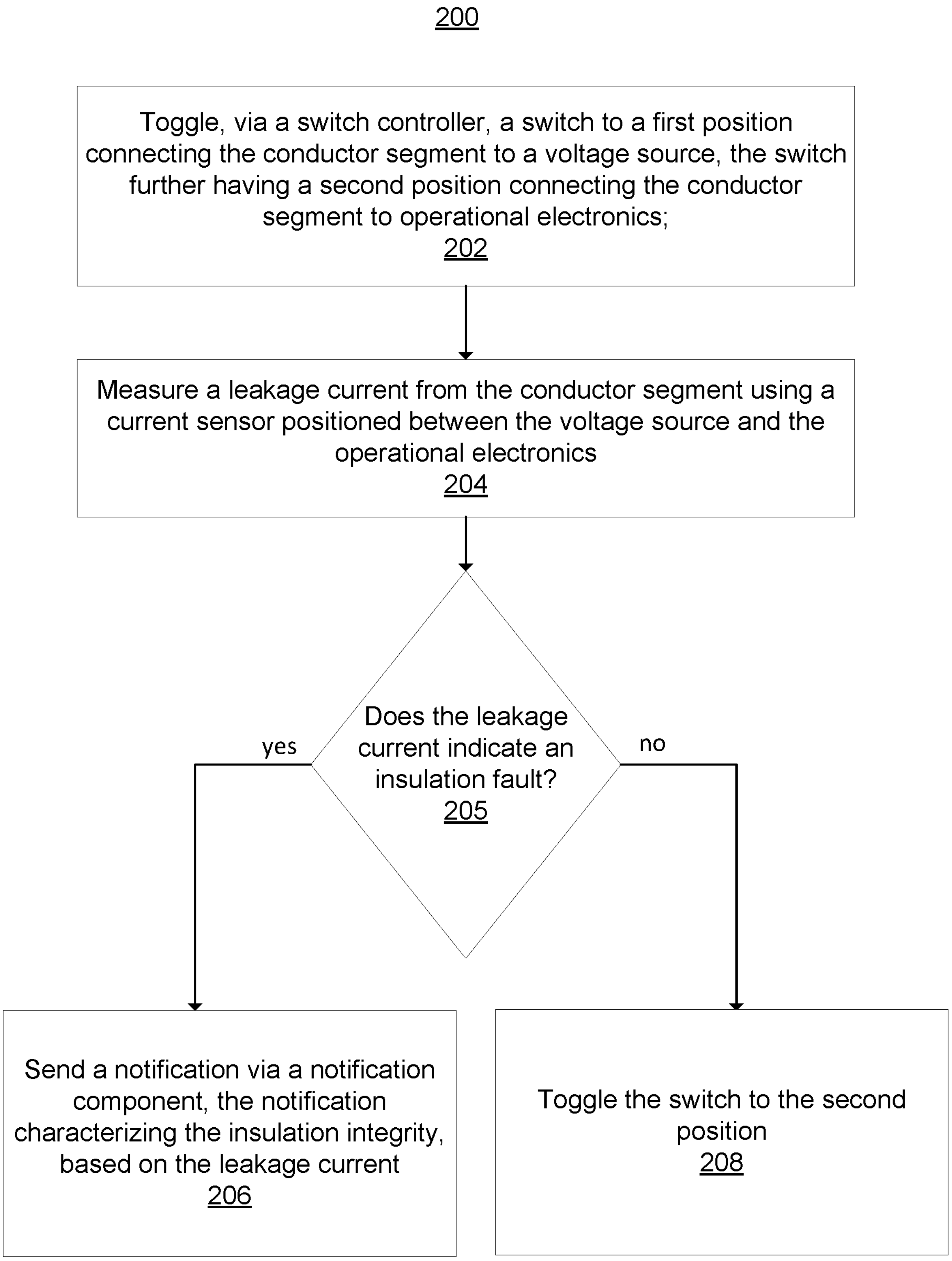
FIG. 2 depicts a flowchart of a method that may be executed to determine an insulation integrity of a conductor segment, according to examples described throughout this disclosure.

FIG. 2 depicts a block diagram of method 200, in accordance with an embodiment. Method 200 may be used to determine an insulation integrity of a conductor segment. Method 200 begins with step 202. In step 202, a switch having a first position connecting the conductor segment to a voltage source and a second position connecting the conductor segment is toggled to operational electronics to the first position. For example, switch 106 may be toggled to first position 108 by switch controller 120. With switch 106 at first position 108, voltage source 118 may provide a potential to conductor segment 104.

Method 200 continues with step 204. In step 204, a leakage current is measured from the conductor segment using a current sensor positioned between the voltage source and the operational electronics. For example, current sensor 122 may monitor for current leakage between conductor segment 104 and reference conductor segment 112, which are both connected to operational electronics 114. By monitoring for leakage current, it may be possible to determine if there are any inherent failures in insulation around conductor segment 104 and/or operational electronics 114.

Method 200 continues with step 205. In step 205 it is determined whether the leakage current detected in step 204 indicates that there is an insulation fault. In examples, the leakage current may be compared to a threshold, as described above. If step 205 evaluates yes, method 200 may continue with step 206. If step 205 evaluates no, method 200 may continue with step 208.

In examples, method 200 may further include step 206. In step 206, a notification may get sent via a notification component, the notification characterizing the insulation integrity, based on the leakage current. For example, notification component 124 may send a notification via communications path 126 characterizing the insulation integrity of conductor segment 104.

Method 200 continues with step 208. In step 208, the switch is toggled to the second position. For example, switch controller 120 may toggle switch 106 to second position 110. In second position 110, operational electronics 116 may be connected to operational electronics 114 again via conductor segment 104. In this way, device 102 may return operational electronics 114 and operational electronics 116 to a nominal operational state.

Method 200 may help provide a way to test the integrity of insulation around conductor segment 104 and/or operational electronics 114 that is quick to perform and easy to execute. This may allow for the test to be performed often. For example, insulation integrity may be checked upon power up or after so many hours of operation. Method 200 may allow for automatic verification and validation of the safety of critical subsystems, and without a need for a technician to disassemble and probe hardware.

Figure 3:
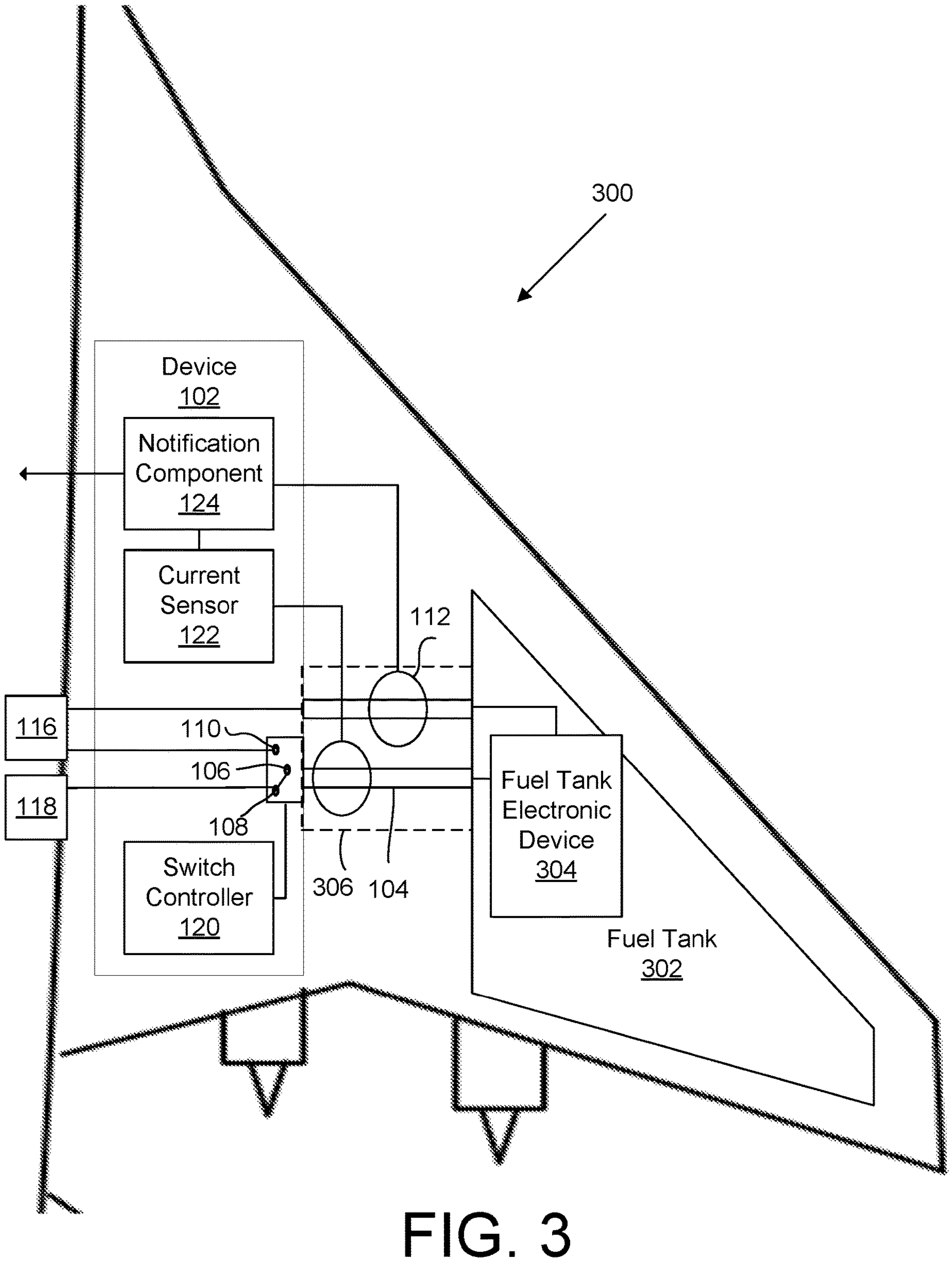
FIG. 3 depicts an example device for determining an insulation integrity of a conductor segment, according to examples described throughout this disclosure.

FIG. 3 depicts a top view of aircraft wing 300, according to an example. Aircraft wing 300 includes two engines and a fuel tank 302. Fuel tank 302 includes a fuel tank electronic device 304, which may be any combination of internal to or coupled to the outside of fuel tank 302. Operational electronics 116 may be positioned within or outside of aircraft wing 300, as depicted in FIG. 3. Conductor segment 104 and reference conductor segment 112 may be part of a wiring harness 306 and are positioned between operational electronics 116 and fuel tank electronic device 304.

In examples, wiring harness 306 may be a cable harness or wiring assembly, or an integrated arrangement of cables within an insulated material. Wiring harness 306 is operable to transfer signal(s) or electrical power between operational electronics 116 and operational electronics 114, for example fuel tank electronic device 304. Conducting segments within wiring harness 306 may be bound together with straps, cable ties, cable lacing, sleeves, electrical tape, conduit, or a combination thereof. The wire harness simplifies the connection to larger components by integrating the wiring into a single unit for "drop-in" installation.

Electronics installed near aircraft fuel tanks must be designed and certified to be intrinsically safe, meaning that they are constructed to prevent electrical arcing or sparking that could ignite fuel vapors. The fuel tank electronic devices installed near or within aircraft fuel tanks vary depending on the aircraft type and its systems, but examples include:

1) Fuel level sensors and probes—These devices measure the amount of fuel in the tank and send the data to the aircraft's fuel system.
2) Fuel pumps—These pumps are used to transfer fuel from the tanks to the engines or other parts of the aircraft.
3) Fuel management systems—These systems help monitor and manage the fuel usage, distribution, and storage on the aircraft.
4) Fuel tank inerting systems—These systems use nitrogen or another inert gas to reduce the oxygen concentration in the fuel tank, thereby reducing the risk of fire or explosion.
5) Fuel quantity indication systems—These systems display the fuel levels in the tanks to the flight crew.

All of these fuel tank electronic devices must meet strict safety standards to ensure that they do not pose a risk of igniting fuel vapors or causing other hazardous conditions.

One way that aircraft fuel system electronics are designed to avoid ignitions is by creating intrinsically safe designs. Intrinsically safe design reduces the available energy from a potential arcing to a level where it would be too low to cause ignition, thereby preventing sparks and keeping temperatures low. Intrinsically safe design includes measures such as designing circuitry with low power and low voltage requirements, or if operational electronics 116 has higher power and voltage requirements, placing it at least a threshold distance away from the fuel tank so that it cannot pose as an ignition source to the fuel therein.

Aircraft wing 300 includes device 102 to determine the insulation integrity of wiring harness 306 and fuel tank electronic device 304. Device 102 includes switch 106 which can toggle between first position 108 connecting voltage source 118 to conductor segment 104, and second position 110 connecting operational electronics 116 to conductor segment 104. Current sensor 122 is operable to measure the leakage current between conductor segment 104 and reference conductor segment 112 when switch 106 is in first position 108, thereby ensuring that operational electronics 116, fuel tank electronic device 304 are intrinsically safe because the insulation on wiring harness 306 is intact.

By allowing for the frequent and/or automatic verification that wiring harness 306 and/or fuel tank electronic device 304 have insulation that is adequate to prevent arcing via device 102, it may be possible to determine that wiring harness 306 and or fuel tank electronic device 304 are intrinsically safe. The inclusion of device 102 in aircraft wing 300 may allow for the design of aircraft wing 300 with a reduction in other traditional safety measures, such as providing a minimum threshold distance between operational electronics 116 and fuel tank 302. This may allow operational electronics 116 and fuel tank 302 to be positioned more closely together, thereby allowing for a safer and more compact fuel management system within an aircraft.

Figure 4:
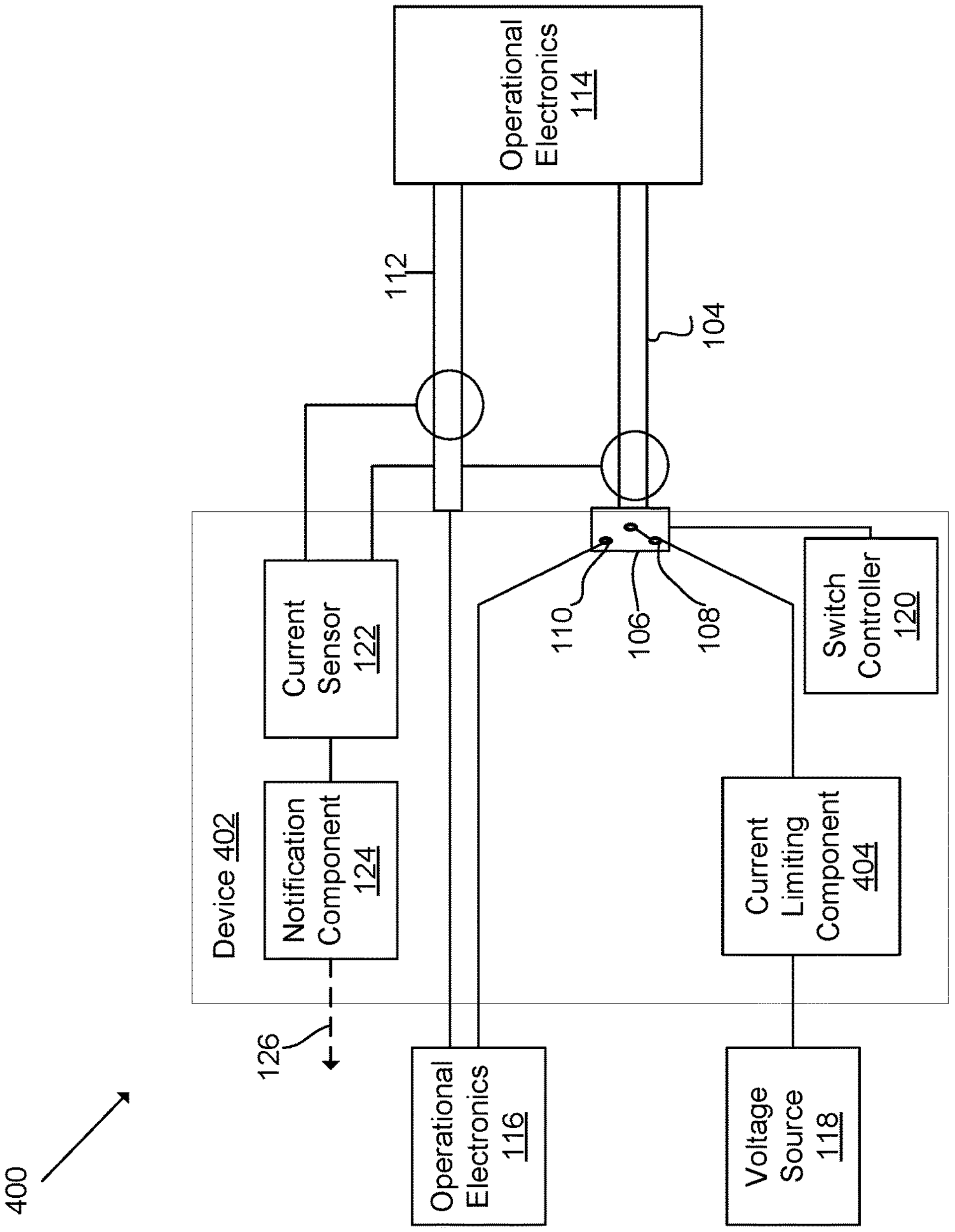
FIG. 4 depicts an example device for determining an insulation integrity of a conductor segment, according to examples described throughout this disclosure.

FIG. 4 depicts system 400, in accordance with an example. System 400 may be similar to system 100, however system 400 includes a device 402 instead of device 102. Device 402 is operable to determine an insulation integrity for conductor segment 104. Device 402 may include similar components to device 102, but device 402 further includes a current limiting component 404.

Current limiting component 404 is configured to limit a current provided by voltage source 118 to a maximum current. In examples, limiting the current may prevent further damage in the event that the insulation of any combination of conductor segment 104, operational electronics 114, and/or reference conductor segment 112 have latent defects. In examples, this may prevent damage to operational electronics 114 when device 402 is used to test for insulation integrity.

In examples, the maximum current of current limiting component 404 may be set based on any combination of a sensitivity to damage of operational electronics 114, an explosion risk in the environment around one or more of device 402, conductor segment 104, operational electronics 114, or reference conductor segment 112, or a safety requirement or regulation. In examples, voltage source 118 and current limiting component 404 may be selected with a voltage level and current limits that limit the energy released in an arcing event to less than a predetermined maximum energy level, for example 200 millijoules or less. In examples, the predetermined maximum energy level may be determined based on a safety regulation or other engineering specification. If it was desirable to provide a predetermined maximum energy level of 200 mJ or less, for example, one way to accomplish this goal could be to combine a 500V voltage source 118 with current limiting component 404 having a 0.4 mA maximum current.

Figure 5:
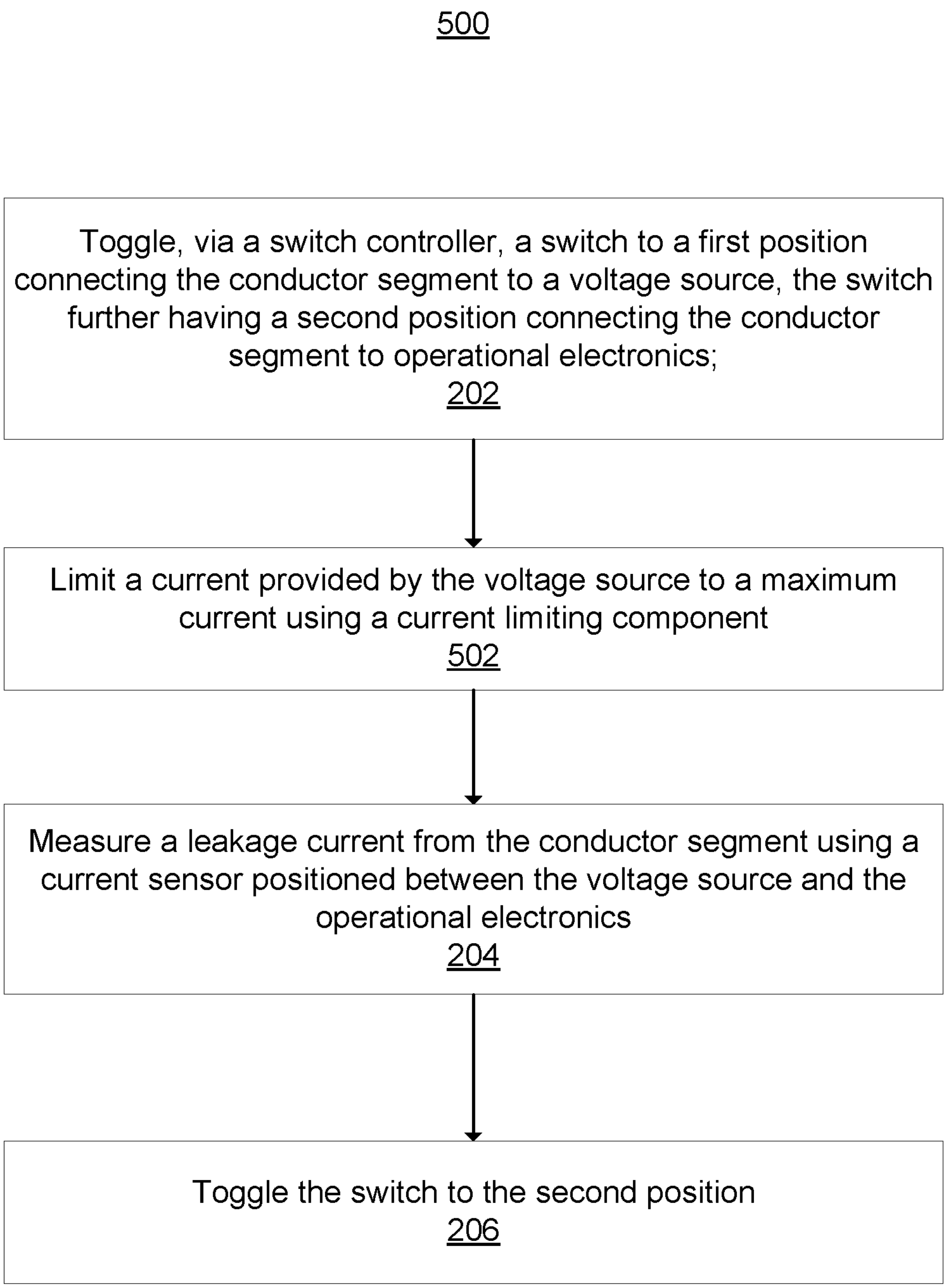
FIG. 5 depicts a flowchart of a method that may be executed to determine an insulation integrity of a conductor segment, according to examples described throughout this disclosure.

FIG. 5 depicts method 500 in accordance with an example. Method 500 may include any combination of steps described with respect to method 200. Method 500 further includes step 502. In step 502, a current provided by the voltage source may be limited to a maximum current using a current limiting component. For example, the current provided by voltage source 118 may be limited to 1 mA using current limiting component 404, as described above.

Figure 6:
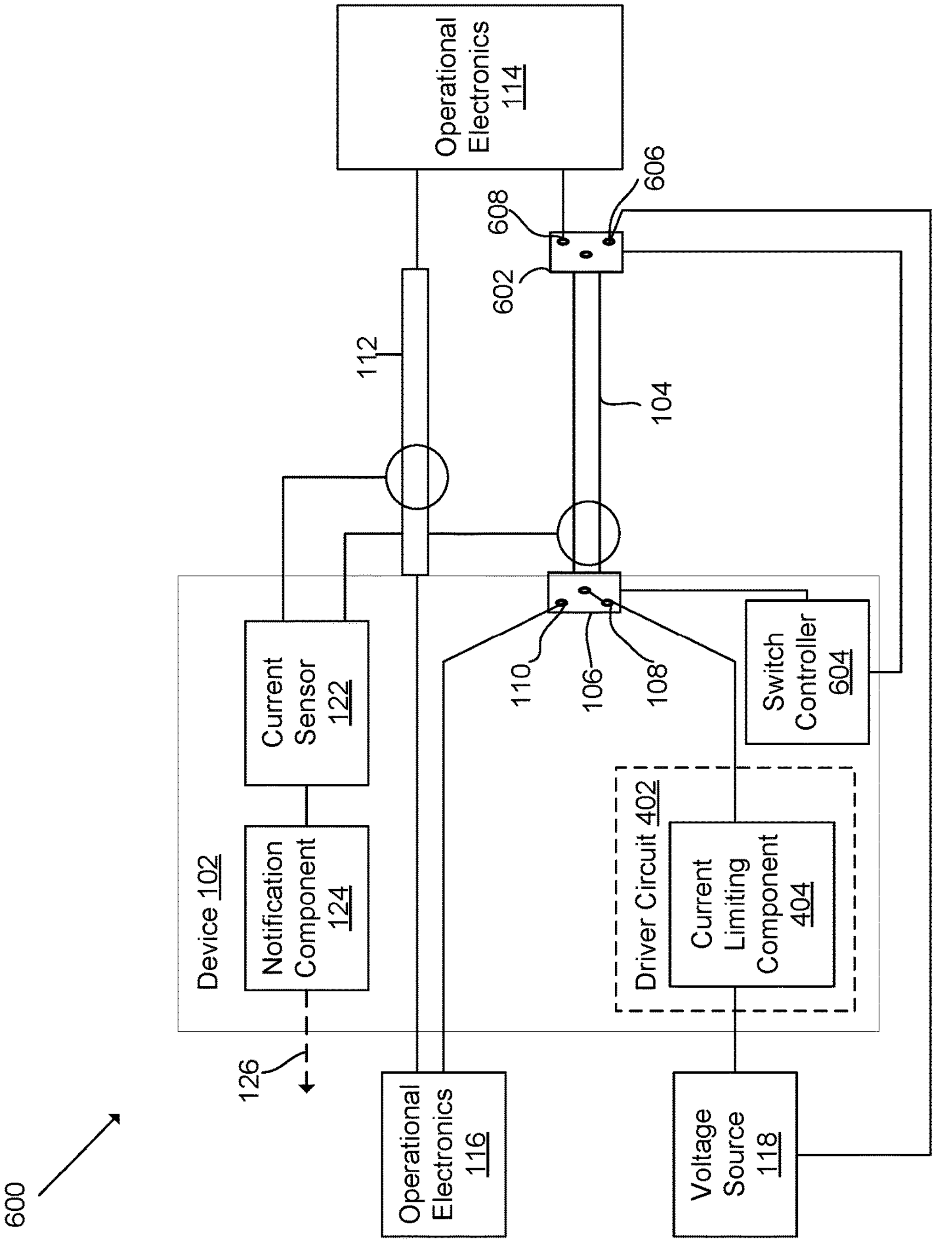
FIG. 6 depicts an example device for determining an insulation integrity of a conductor segment, according to examples described throughout this disclosure.

FIG. 6 depicts system 600, in accordance with an example. System 600 may include similar components to systems 100 and/or 400. System 600 includes a switch 602. System 600 further includes a switch controller 604 instead of conductor segment 104.

In examples, switch controller 604 may be operable to control switch in addition to switch 106. Switch 602 may be positioned at an end of conductor segment 104 opposing device 102, switch 602 including a third position 606 operable to connect conductor segment 104 to voltage source 118 and a fourth position 608 operable to connect conductor segment 104 to operational electronics 114. This may allow switch 602 to isolate conductor segment 104 from operational electronics 114 as voltage source 118 is applied to conductor segment 104. In instances where operational electronics 114 are very sensitive or in an explosive environment, this may ensure further safety when testing the insulation around conductor segment 104. Switch 602 may also help further isolate testing the integrity of the insulation around 104.

Figure 7:
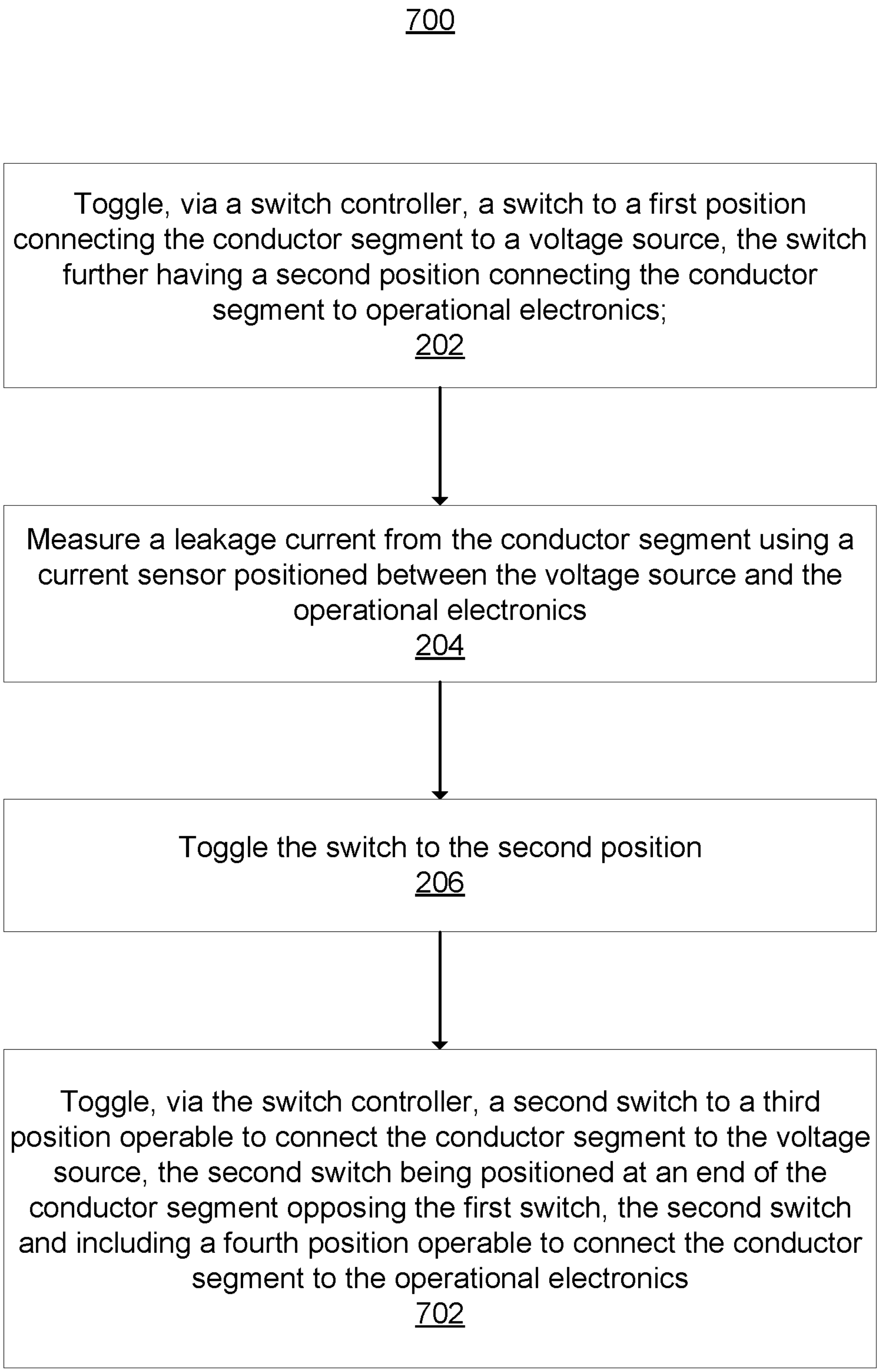
FIG. 7 depicts a flowchart of a method that may be executed to determine an insulation integrity of a conductor segment, according to examples described throughout this disclosure.

FIG. 7 depicts method 700, in accordance with an example. Method 700 may include any combination of steps described with respect to methods 200 or 500. Method 700 further includes step 702. In step 702, a second switch may be toggled, via the switch controller, to a third position operable to connect the conductor segment to the voltage source, the second switch being positioned at an end of the conductor segment opposing the first switch, the second switch and including a fourth position operable to connect the conductor segment to the operational electronics.

For example, switch controller 604 may toggle switch 602 to third position 606, thereby connecting conductor segment 104 to voltage source 118. Switch 602 may further include fourth position 608, operable to connect conductor segment 104 to operational electronics 114. Switch 602 may be positioned at a second end of conductor segment 104 opposing switch 106, as described above.

Figure 8:
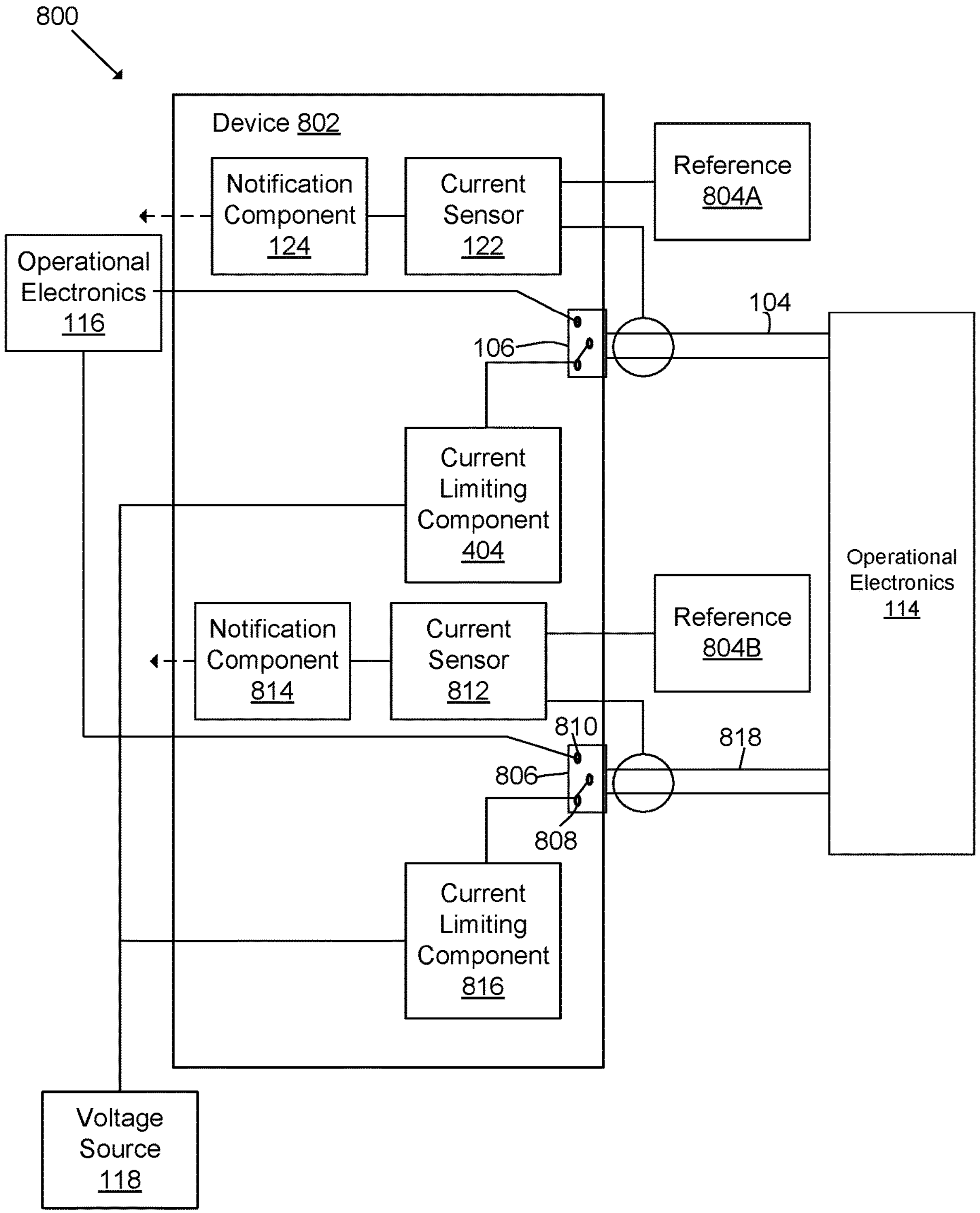
FIG. 8 depicts an example device for determining an insulation integrity of a conductor segment, according to examples described throughout this disclosure.

FIG. 8 depicts system 800, in accordance with an example. System 800 may include similar components to those described with respect to systems 100, 400, and/or 600. System 800 includes switch 106 along with a third switch 806. Third switch 806 has a fifth position 808 operable to connect voltage source 118 to a second conductor segment 818. Third switch 806 has a sixth position 810 operable to connect second conductor segment 818 to operational electronics 116.

System 800 includes a second current sensor 812 that detects a second leakage current from second conductor segment 818, similar to how current sensor 122 detects a leakage current on conductor segment 104, as described above.

In examples, third switch 806 may be associated with a second notification component 814. In further examples, however, third switch 806 may be associated with notification component 124.

In examples, third switch 806 may be associated with a current limiting component 816, which is similar to current limiting component 404 described above.

In examples, third switch 806 may be associated with an additional switch (not pictured) positioned at a second end of second conductor segment 818, operable to connect second conductor segment 818 to voltage source 118 or operational electronics 114, similar to switch 602 described above.

In examples, conductor segment 104 and second conductor segment 818 may be part of a single wiring harness or may be separate.

In the example of system 800, current sensor 122 may measure leakage current between conductor segment 104 and a reference 804A and second current sensor 812 may measure leakage current between second conductor segment 818 and a reference 804B. In examples, reference 804A and reference 804B may be any reference voltage. In examples, reference 804A and reference 804B may be a ground. For example, if system 800 is part of an aircraft, reference 804A and reference 804B may be coupled to the aircraft ground.

Figure 9:
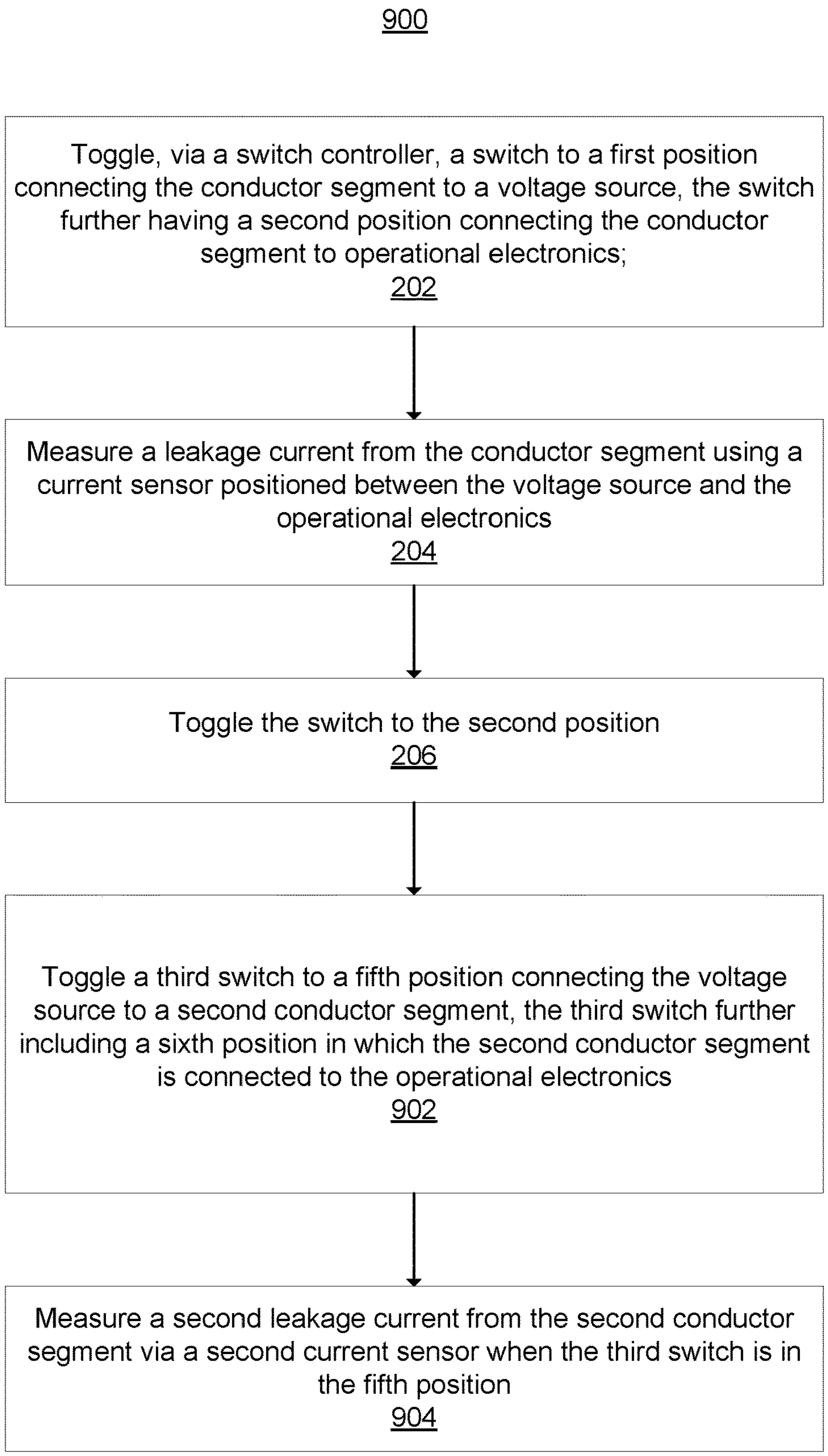
FIG. 9 depicts a flowchart of a method that may be executed to determine an insulation integrity of a conductor segment, according to examples described throughout this disclosure.

FIG. 9. depicts method 900, in accordance with an embodiment. Method 900 may include any combination of steps described with respect to methods 200, 500, and/or 700 above. Method 900 includes at least one of additional steps 902 and 904.

In step 902, a third switch may be toggled into to a fifth position connecting the voltage source to a second conductor segment, the third switch further including a sixth position in which the second conductor segment is connected to the operational electronics. For example, third switch 806 may be toggled to fifth position 808 connecting voltage source 118 to second conductor segment 818. Third switch 806 may further include sixth position 810 operable to connect second conductor segment 818 and operational electronics 116, as described above.

In step 904, a second leakage current may be measured from the second conductor segment via a second current sensor when the third switch is in the fifth position. For example, the second leakage current may be measured on second conductor segment 818 via second current sensor 812 when third switch 806 is in fifth position 808, as described above.

In examples, steps 902 and 904 may be repeated any number of additional times with any number of additional switches, voltage sources, a current sensors to test any number of additional conductor segments.

By providing multiple switches 106 and 806 operable to apply voltage source 118 to conductor segments 104 and 818, respectively, it may be possible to test the insulation integrity of multiple conductor segments. In examples, the insulation tests may be performed sequentially or at the same time. In examples, the insulation tests may be performed at subsystem boot or power on, for example when one or both of operational electronics 116 and operational electronics 114 are booted or powered on. In examples, the insulation tests may be performed periodically at pre-determined intervals of time or after a pre-determined number of operational hours.

In the aviation environment, the insulation integrity tests may be performed on the ground during maintenance without passengers or personnel aboard, especially if operating switch any of the switches described above could disable or take operational electronics 114 offline during critical flight operations.

Several embodiments have been described. Nevertheless, it will be understood that various modifications may be made without departing from the spirit and scope of the specification.

Logic flows depicted in the figures, if any, do not require the particular order shown, or sequential order, to achieve desirable results. In addition, other steps may be provided, or steps may be eliminated, from the described flows, and other components may be added to, or removed from, the described systems.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In some aspects, the techniques described herein relate to a device, wherein the voltage source is between 200V and 2000V.

In some aspects, the techniques described herein relate to a device, wherein the device further includes: a current limiting component configured to limit a current provided by the voltage source to a maximum current.

In some aspects, the techniques described herein relate to a device, wherein, combined with a voltage provided by the voltage source, the current limiting component limits the energy provided by the voltage source to less than 200 millijoules.

In some aspects, the techniques described herein relate to a device, wherein the conductor segment is at least one of a wire, a wire shield, or a conductive portion of a wire harness assembly.

In some aspects, the techniques described herein relate to a device, wherein the conductor segment is a portion of a wiring harness.

In some aspects, the techniques described herein relate to a device, wherein the conductor segment is a first conductor segment, and the current sensor is connected around the first conductor segment and a second conductor segment.

In some aspects, the techniques described herein relate to a device, wherein the current sensor is connected between the conductor segment and a ground.

In some aspects, the techniques described herein relate to a device, wherein the current sensor is a comparator circuit or a hall effect sensor.

In some aspects, the techniques described herein relate to a device, wherein the current sensor is operable to measure the leakage current below 5 mAmps.

In some aspects, the techniques described herein relate to a device, wherein the is further configured to determine that the leakage current is higher than a threshold current.

In some aspects, the techniques described herein relate to a device, wherein the switch is a first switch, the operational electronics is a first operational electronics, and the switch controller is further configured to operable a second switch positioned at an end of the conductor segment opposing the first switch, the second switch including a third position operable to connect the conductor segment to the voltage source and a fourth position operable to connect the conductor segment to the operational electronics.

In some aspects, the techniques described herein relate to a device, wherein the operational electronics is a fuel tank electronic device.

In some aspects, the techniques described herein relate to a device, wherein the switch is a first switch, the current sensor is a first current sensor, the conductor segment is a first conductor segment, the leakage current is a first leakage current, and the device further includes: a third switch having a fifth position connecting the voltage source to a second conductor segment and a sixth position connecting the second conductor segment to the operational electronics; and a second current sensor configured to detect a second leakage current from the second conductor segment when the third switch is in the fifth position.

In some aspects, the techniques described herein relate to a device, further including: a notification component configured to provide a notification characterizing the insulation integrity, based on the leakage current.

In some aspects, the techniques described herein relate to a method, wherein the voltage source is between 200V and 2000V.

In some aspects, the techniques described herein relate to a method, wherein the method further includes: limiting a current provided by the voltage source to a maximum current using a current limiting component.

In some aspects, the techniques described herein relate to a method, wherein, combined with a voltage provided by the voltage source, the current limiting component limits the energy provided by the voltage source to less than 200 millijoules.

In some aspects, the techniques described herein relate to a method, wherein the conductor segment is one of a wire, a wire shield, or a conductive portion of a wire harness assembly.

In some aspects, the techniques described herein relate to a method, wherein the conductor segment is a portion of a wiring harness.

In some aspects, the techniques described herein relate to a method, wherein the conductor segment is a first conductor segment, and the current sensor is connected between the first conductor segment and a second conductor segment.

In some aspects, the techniques described herein relate to a method, wherein the current sensor is connected between the conductor segment and a ground.

In some aspects, the techniques described herein relate to a method, wherein the current sensor is a comparator circuit or a hall effect sensor.

In some aspects, the techniques described herein relate to a method, wherein the current sensor is operable to measure the leakage current below 5 mAmps.

In some aspects, the techniques described herein relate to a method, wherein the current sensor is further configured to determine that the leakage current is higher than a threshold current.

In some aspects, the techniques described herein relate to a method, wherein the switch is a first switch, the operational electronics is a first operational electronics, and method further includes: toggling, via the switch controller, a second switch to a third position operable to connect the conductor segment to the voltage source, the second switch being positioned at an end of the conductor segment opposing the first switch, the second switch and including a fourth position operable to connect the conductor segment to the operational electronics.

In some aspects, the techniques described herein relate to a method, wherein the operational electronics is a fuel tank electronic device.

In some aspects, the techniques described herein relate to a method, wherein the switch is a first switch, the current sensor is a first current sensor, the conductor segment is a first conductor segment, the leakage current is a first leakage current, and the method further includes: toggling a third switch to a fifth position connecting the voltage source to a second conductor segment, the third switch further including a sixth position in which the second conductor segment is connected to the operational electronics; and measuring a second leakage current from the second conductor segment via a second current sensor when the third switch is in the fifth position.

In some aspects, the techniques described herein relate to a method, further including: sending a notification via a notification component, the notification characterizing the insulation integrity, based on the leakage current.

What is claimed is:

1. A device for determining an insulation integrity of a conductor segment, the device comprising:

a switch having a test position in which the switch connects a voltage source to the conductor segment and an operational position in which the conductor segment is connected to operational electronics;

a current limiting component configured to limit a current provided by the voltage source to the conductor segment to a maximum current;

a current sensor positioned between the voltage source and the operational electronics configured to compare a leakage current from the conductor segment to a current threshold when the switch is in the test position; and a switch controller configured to:

upon receiving an activation indication, actuate the switch from the operational position to the test position, and upon determining that the leakage current is greater than the current threshold, initiate a fault action.

2. The device of claim 1, wherein the voltage source is between 200V and 2000V.

3. The device of claim 1, wherein, combined with a voltage provided by the voltage source, the current limiting component limits energy provided by the voltage source to less than 200 millijoules.

4. The device of claim 1, wherein the conductor segment is at least one of a wire, a wire shield, or a conductive portion of a wire harness assembly.

5. The device of claim 1, wherein the conductor segment is a portion of a wiring harness.

6. The device of claim 1, wherein the conductor segment is a first conductor segment, and the current sensor is connected around the first conductor segment and a second conductor segment.

7. The device of claim 1, wherein the current sensor is connected between the conductor segment and a ground.

8. The device of claim 1, wherein the current sensor is a comparator circuit or a hall effect sensor.

9. The device of claim 1, wherein the current sensor is operable to measure the leakage current below 5 mAmps.

10. The device of claim 1, wherein the switch is a first switch, the operational position is a first operational position, the test position is a first test position, the operational electronics is a first operational electronics, and the switch controller is further configured to operate a second switch positioned at an end of the conductor segment opposing the first switch, the second switch including a second test position operable to connect the conductor segment to the voltage source and a second operational position operable to connect the conductor segment to the operational electronics.

11. The device of claim 1, wherein the operational electronics is a fuel tank electronic device.

12. The device of claim 1, wherein the switch is a first switch, the operational position is a first operational position, the test position is a first test position, the current sensor is a first current sensor, the conductor segment is a first conductor segment, the leakage current is a first leakage current, and the device further comprises:

a second switch having a second test position connecting the voltage source to a second conductor segment and a second operational position connecting the second conductor segment to the operational electronics; and a second current sensor configured to detect a second leakage current from the second conductor segment when the second switch is in the test position.

13. The device of claim 1, wherein the fault action includes a notification.

14. A method for determining an insulation integrity of a conductor segment, the method comprising:

transmitting an activation indication to a switch controller;

upon receiving the activation indication, actuating a switch to a test position connecting the conductor segment to a voltage source via the switch controller, the switch further including an operational position connecting the conductor segment to operational electronics;

limiting current provided by the voltage source to the conductor segment to maximum current via a current limiting component;

comparing a leakage current from the conductor segment to a current threshold when the switch is in the test position using a current sensor positioned between the voltage source and the operational electronics; and upon determining that the leakage current is greater than the current threshold, initiating a fault action.

15. The method of claim 14, wherein the voltage source is between 200V and 2000V.

16. The method of claim 14, wherein, combined with a voltage provided by the voltage source, the current limiting component limits energy provided by the voltage source to less than 200 millijoules.

17. The method of claim 14, wherein the conductor segment is one of a wire, a wire shield, or a conductive portion of a wire harness assembly.

18. The method of claim 14, wherein the conductor segment is a portion of a wiring harness.

19. The method of claim 14, wherein the conductor segment is a first conductor segment, and the current sensor is connected between the first conductor segment and a second conductor segment.

20. The method of claim 14, wherein the current sensor is connected between the conductor segment and a ground.

21. The method of claim 14, wherein the current sensor is a comparator circuit or a hall effect sensor.

22. The method of claim 14, wherein the current sensor is operable to measure the leakage current below 5 mAmps.

23. The method of claim 14, wherein the switch is a first switch, the operational position is a first operational position, the test position is a first test position, the operational electronics is a first operational electronics, and method further comprises:

toggling, via the switch controller, a second switch to a second test position operable to connect the conductor segment to the voltage source, the second switch being positioned at an end of the conductor segment opposing the first switch, the second switch and including a second operational position operable to connect the conductor segment to the operational electronics.

24. The method of claim 14, wherein the operational electronics is a fuel tank electronic device.

25. The method of claim 14, wherein the switch is a first switch, the operational position is a first operational position, the test position is a first test position, the current sensor is a first current sensor, the conductor segment is a first conductor segment, the leakage current is a first leakage current, and the method further comprises:

toggling a second switch to a test position connecting the voltage source to a second conductor segment, the second switch further including a operational position in which the second conductor segment is connected to the operational electronics; and measuring a second leakage current from the second conductor segment via a second current sensor when the second switch is in the test position.

26. The method of claim 14, wherein the fault action includes a notification.

27. The device of claim 1, wherein the activation indication indicates a power up activity or a scheduled event.

28. The method of claim 14, wherein the activation indication indicates a power up activity or a scheduled event.

29. The method of claim 14, further comprising:

upon determining that the leakage current is greater than the current threshold, actuating the switch from the test position to the operational position.

30. A system for determining an insulation integrity of a conductor segment, the system comprising:

a switch having a test position in which the switch connects a voltage source to the conductor segment and an operational position in which the conductor segment is connected to operational electronics;

a current limiting component configured to limit a current provided by the voltage source to the conductor segment to a maximum current;

a current sensor positioned between the voltage source and the operational electronics configured to compare a leakage current from the conductor segment to a current threshold when the switch is in the test position; and a switch controller configured to:

upon receiving an activation indication, actuate the switch from the operational position to the test position, and upon determining that the leakage current is greater than the current threshold, initiating a fault action.

* * * * *